(12) United States Patent
Lai

(10) Patent No.: US 11,626,517 B2
(45) Date of Patent: Apr. 11, 2023

(54) SEMICONDUCTOR STRUCTURE INCLUDING VERTICAL CHANNEL PORTION AND MANUFACTURING METHOD FOR THE SAME

(71) Applicant: MACRONIX INTERNATIONAL CO., LTD., Hsinchu (TW)

(72) Inventor: Erh-Kun Lai, Taichung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 17/228,795

(22) Filed: Apr. 13, 2021

(65) Prior Publication Data
US 2022/0328686 A1    Oct. 13, 2022

(51) Int. Cl.
*H01L 29/78*         (2006.01)
*H01L 27/11582*      (2017.01)
*H01L 29/66*         (2006.01)
*H01L 29/423*        (2006.01)

(52) U.S. Cl.
CPC .... *H01L 29/7827* (2013.01); *H01L 27/11582* (2013.01); *H01L 29/42392* (2013.01); *H01L 29/66666* (2013.01)

(58) Field of Classification Search
CPC ........... H01L 29/7827; H01L 27/11582; H01L 29/42392; H01L 29/66666
USPC ........................................................ 257/329
See application file for complete search history.

(56) References Cited

U.S. PATENT DOCUMENTS

| | | | |
|---|---|---|---|
| 9,755,073 B1* | 9/2017 | Cheng | H01L 29/42392 |
| 9,768,072 B1* | 9/2017 | Cheng | H01L 21/76232 |
| 9,837,405 B1* | 12/2017 | Cheng | H01L 21/31111 |
| 10,008,417 B1* | 6/2018 | Bao | H01L 21/823412 |
| 10,367,003 B2 | 7/2019 | Kang et al. | |
| 10,790,297 B2 | 9/2020 | Chen et al. | |
| 2014/0159114 A1* | 6/2014 | Zheng | H01L 29/66477 438/585 |
| 2015/0079742 A1 | 3/2015 | Pachamuthu et al. | |
| 2015/0380431 A1 | 12/2015 | Kanamori et al. | |
| 2016/0126107 A1 | 5/2016 | Kil et al. | |
| 2017/0358660 A1* | 12/2017 | Cheng | H01L 21/02129 |
| 2017/0373188 A1* | 12/2017 | Mochizuki | H01L 29/7827 |
| 2018/0269320 A1* | 9/2018 | Chi | H01L 29/66795 |
| 2019/0172927 A1* | 6/2019 | Jagannathan | H01L 29/7827 |
| 2020/0006331 A1* | 1/2020 | Li | H01L 21/823431 |
| 2020/0006376 A1* | 1/2020 | Makala | H01L 29/40117 |
| 2020/0258941 A1* | 8/2020 | Lee | H01L 45/08 |
| 2020/0395379 A1 | 12/2020 | Lee et al. | |
| 2021/0036001 A1 | 2/2021 | Kim et al. | |

(Continued)

FOREIGN PATENT DOCUMENTS

| | | |
|---|---|---|
| CN | 104733469 A | 6/2015 |
| CN | 105573052 A | 5/2016 |

(Continued)

*Primary Examiner* — Mohammad M Hoque
(74) *Attorney, Agent, or Firm* — McClure, Qualey & Rodack, LLP

(57) ABSTRACT

A semiconductor structure and a manufacturing method for the same are provided. The semiconductor structure comprises a channel element. The channel element comprises a substrate portion and a vertical channel portion. The vertical channel portion is adjoined on the substrate portion. The substrate portion and the vertical channel portion both comprise single crystal silicon.

12 Claims, 13 Drawing Sheets

(56) References Cited

U.S. PATENT DOCUMENTS

2021/0098489 A1    4/2021  Zhu
2021/0408032 A1*  12/2021  Baraskar .......... H01L 29/40117

FOREIGN PATENT DOCUMENTS

| | | | |
|---|---|---|---|
| CN | 107527914 | A | 12/2017 |
| CN | 110911417 | A |  3/2020 |
| CN | 111933647 | A | 11/2020 |
| CN | 112071855 | A | 12/2020 |
| CN | 112310101 | A |  2/2021 |
| TW | 202015217 | A |  4/2020 |
| TW | 202109770 | A |  3/2021 |
| TW | 202114149 | A |  4/2021 |

* cited by examiner

SEMICONDUCTOR STRUCTURE INCLUDING VERTICAL CHANNEL PORTION AND MANUFACTURING METHOD FOR THE SAME

BACKGROUND

Technical Field

The disclosure relates to a semiconductor structure and a manufacturing method for the same.

Description of the Related Art

With development of the semiconductor technology, semiconductor devices have become smaller in size. In the semiconductor technology, shrinking of feature sizes, and improving operation speed, efficiency, density, and cost per Integrated circuit are important objectives. For satisfy customer need and the market demand, it is important to shrink devices in size and also to maintain the electricity of devices.

SUMMARY

The present disclosure relates to a semiconductor structure and a manufacturing method for the same.

According to a concept of the present disclosure, a semiconductor structure is provided. The semiconductor structure comprises a channel element. The channel element comprises a substrate portion and a vertical channel portion. The vertical channel portion is adjoined on the substrate portion. The substrate portion and the vertical channel portion both comprise single crystal silicon.

According to another concept of the present disclosure, a semiconductor structure is provided. The semiconductor structure comprises a channel element. The channel element comprises a substrate portion and a vertical channel portion. The vertical channel portion is adjoined on the substrate portion. The substrate portion and the vertical channel portion as a whole have a uniform and/or continuous crystal structure.

According to yet another concept of the present disclosure, a manufacturing method for a semiconductor structure is provided. The method comprises the following steps. A channel material base is provided. The channel material base comprises a substrate portion and an upper channel material portion adjoined on the substrate portion. An etching step is performed to pattern the upper channel material portion so as to form a vertical channel portion, and define an upper substrate surface of the substrate portion.

The above and other embodiments of the disclosure will become better understood with regard to the following detailed description of the non-limiting embodiment(s). The following description is made with reference to the accompanying drawings.

DETAILED DESCRIPTION

The illustrations may not be necessarily drawn to scale, and there may be other embodiments of the present disclosure which are not specifically illustrated. Thus, the specification and the drawings are to be regard as an illustrative sense rather than a restrictive sense. Moreover, the descriptions disclosed in the embodiments of the disclosure such as detailed construction, manufacturing steps and material selections are for illustration only, not for limiting the scope of protection of the disclosure. The steps and elements in details of the embodiments could be modified or changed according to the actual needs of the practical applications. The disclosure is not limited to the descriptions of the embodiments. The illustration uses the same/similar symbols to indicate the same/similar elements.

Figure 1:
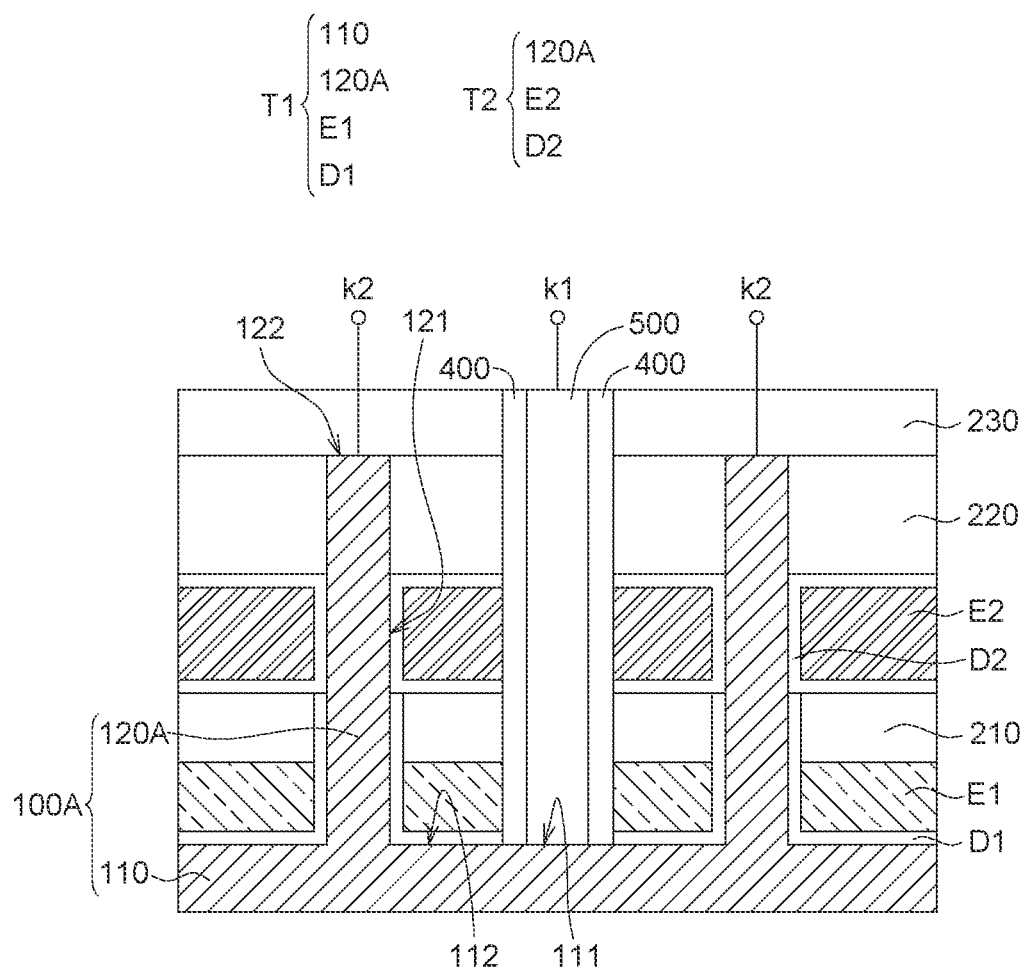
FIG. 1 illustrates a cross-section view of a semiconductor structure in an embodiment.

FIG. 1 is referred to, which illustrates a cross-section view of a semiconductor structure in an embodiment. A channel element 100A comprises a substrate portion 110 and a vertical channel portion 120A. The vertical channel portion 120A is connected on the substrate portion 110.

In an embodiment, the substrate portion 110 and the vertical channel portion 120A both comprise a single crystal material, such as single crystal silicon, and thus have good carrier mobility. In an embodiment, none of a crystal interface (such as a horizontal crystal interface or a crystal interface plane) exists in an interior of the channel element 100A (i.e. the substrate portion 110 and the vertical channel portion 120A as a whole). The substrate portion 110 and the vertical channel portion 120A have a uniform and/or continuous crystal structure. Therefore the channel element 100A has good carrier mobility. In an embodiment, the substrate portion 110 and the vertical channel portion 120A may consist of single crystal silicon.

The substrate portion 110 comprises a first upper channel end surface 111 and an upper substrate surface 112. The vertical channel portion 120A has a solid pillar shape. The vertical channel portion 120A comprises a channel sidewall surface 121 and a second upper channel end surface 122. The second upper channel end surface 122 is above the first upper channel end surface 111. The channel sidewall surface 121 is between the upper substrate surface 112 and the second upper channel end surface 122. The upper substrate surface 112 is between the first upper channel end surface 111 and the channel sidewall surface 121. Opposing end surfaces of the channel element 100A are the first upper channel end surface 111 and the second upper channel end surface 122.

A first gate electrode layer E1 is adjacent to the upper substrate surface 112 of the substrate portion 110 and the channel sidewall surface 121 of the vertical channel portion 120A. A first dielectric layer D1 is between the first gate electrode layer E1 and the channel element 100A. A first insulating layer 210 is on an upper surface of the first gate electrode layer E1. A second gate electrode layer E2 is above the upper substrate surface 112 of the substrate portion 110 and adjacent to the channel sidewall surface 121 of the vertical channel portion 120A. The second gate electrode layer E2 is on an upper surface of the first insulating layer 210. A second dielectric layer D2 is between the second gate electrode layer E2 and the vertical channel portion 120A of the channel element 100A. A second insulating layer 220 is on the second dielectric layer D2 on an upper surface of the second gate electrode layer E2. A third insulating layer 230 is on the second insulating layer 220 and the vertical channel portion 120A. An insulating element 400 passes through the first dielectric layer D1, the first gate electrode layer E1, the second dielectric layer D2, the second gate electrode layer E2, the second insulating layer 220 and the third insulating layer 230. A conductive layer 500 passes through the insulating element 400 and electrically connected on the first upper channel end surface 111 of the substrate portion 110.

A transistor T1 comprises the substrate portion 110 of the channel element 100A and the vertical channel portion 120A, the first gate electrode layer E1 and the first dielectric layer D1. A transistor T2 comprises the vertical channel portion 120A of the channel element 100A, the second gate electrode layer E2 and the second dielectric layer D2. The first dielectric layer D1 may have a material set different from a material set of the second dielectric layer D2.

The first upper channel end surface 111 and the second upper channel end surface 122 of the channel element 100A are electrically connected to a first source/drain terminal k1 and a second source/drain terminal k2 respectively. The conductive layer 500 is electrically connected between the first upper channel end surface 111 of the substrate portion 110 and the first source/drain terminal k1. The first source/drain terminal k1 is one of a source terminal and a drain terminal. The second source/drain terminal k2 is the other of the source terminal and the drain terminal.

In an embodiment, the transistor T1 is an access transistor, and the first dielectric layer D1 of which may comprise a dielectric material film suitable for functioning as a gate dielectric layer. The dielectric material film may comprise an oxide such as silicon oxide, a nitride such as silicon nitride, or other suitable film materials. The transistor T2 may be a memory transistor, and the second dielectric layer D2 of which may comprise a dielectric material film suitable for functioning as a memory layer. The second dielectric layer D2 may comprise an oxide-nitride-oxide (ONO) structure. However, the present disclosure is not limited thereto. The memory layer may comprise any kind of charge trapping structure, such as an ONONO structure, an ONONONO structure, or a BE-SONOS structure, etc. For example, a charge trapping layer may use a nitride such as silicon nitride, or other high-K materials comprising a metal oxide such as $Al_2O_3$, $HfO_2$, etc. The first source/drain terminal k1 may be a terminal of a source line (SL) or reference line. The second source/drain terminal k2 may be a terminal of a drain line or bit line (BL).

In another embodiment, the transistor T1 is a memory transistor, and the first dielectric layer D1 of which may comprise the dielectric material film suitable for functioning as a memory layer as described above. The transistor T2 is an access transistor, and the second dielectric layer D2 of which may comprise the dielectric material film suitable for functioning as a gate dielectric layer as described above. The first source/drain terminal k1 may be the terminal of the drain line or bit line. The second source/drain terminal k2 may be the terminal of the source line or reference line.

In embodiments, the semiconductor structure may be applied to a vertical channel 3D 2T NOR memory device having a memory array of memory cells each comprising the transistor T1 and the transistor T2. The access transistor may be functioned as a field-effect transistor.

Figure 2:
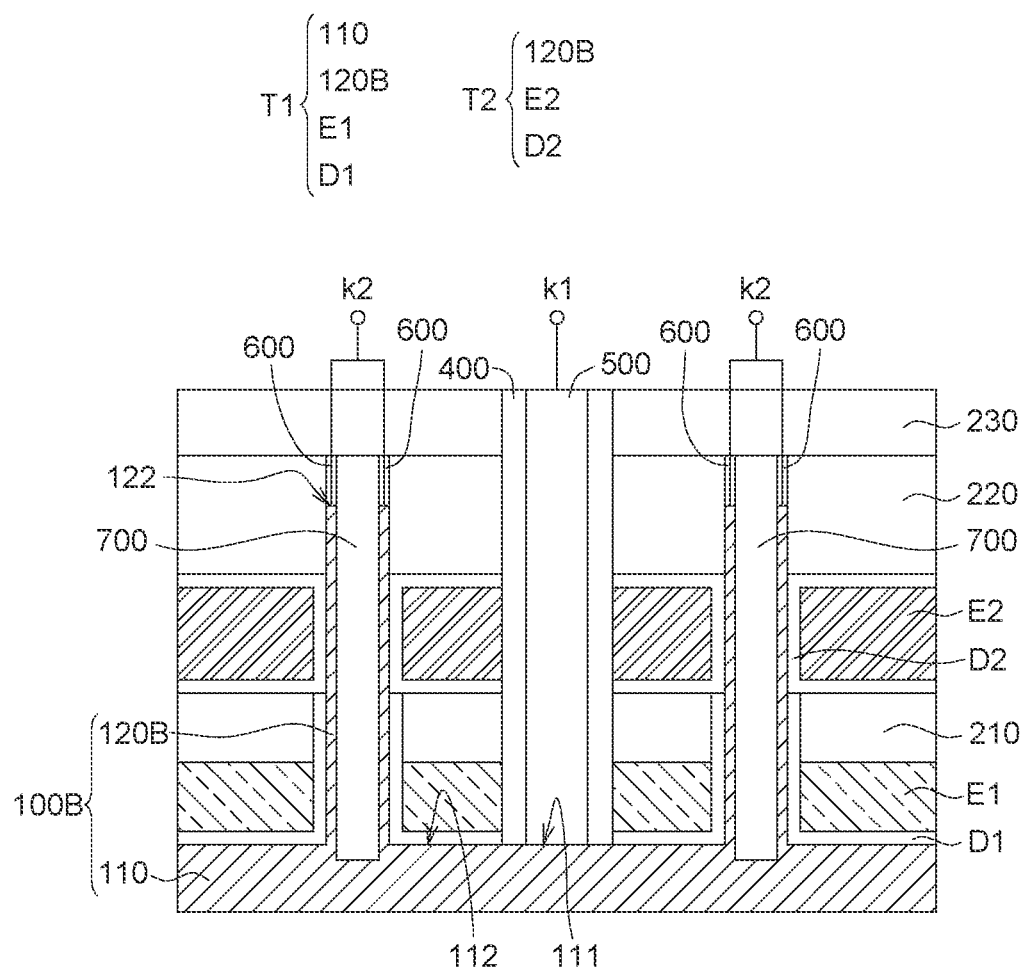
FIG. 2 illustrates a cross-section view of a semiconductor structure in another embodiment.

FIG. 2 illustrates a cross-section view of a semiconductor structure in another embodiment, which is different from the semiconductor structure shown in FIG. 1 with the following description. A spacer 600 is on the second upper channel end surface 122 of a vertical channel portion 120B of a channel element 100B. The vertical channel portion 120B and the spacer 600 may have a tubular shape (or hollow pillar shape). In an embodiment, the vertical channel portion 120B and the spacer 600 may have a circular tube shape. The present disclosure is not limited thereto. In other embodiments, the vertical channel portion 120B and the spacer 600 may have a tubular shape of an elliptical form, or a regular (or symmetrical)/irregular (or asymmetrical) curved or polygon ring form. An insulating pillar 700 passes through the vertical channel portion 120B and the spacer 600. The insulating pillar 700 is within a sidewall surface of the vertical channel portion 120B and a sidewall surface of the spacer 600. A bottom surface of the insulating pillar 700 is below the upper substrate surface 112 of the substrate portion 110. The third insulating layer 230 is on the second insulating layer 220, the spacer 600 and the insulating pillar 700.

FIG. 3 to FIG. 17 illustrate a manufacturing method for a semiconductor structure in an embodiment.

Figure 3:
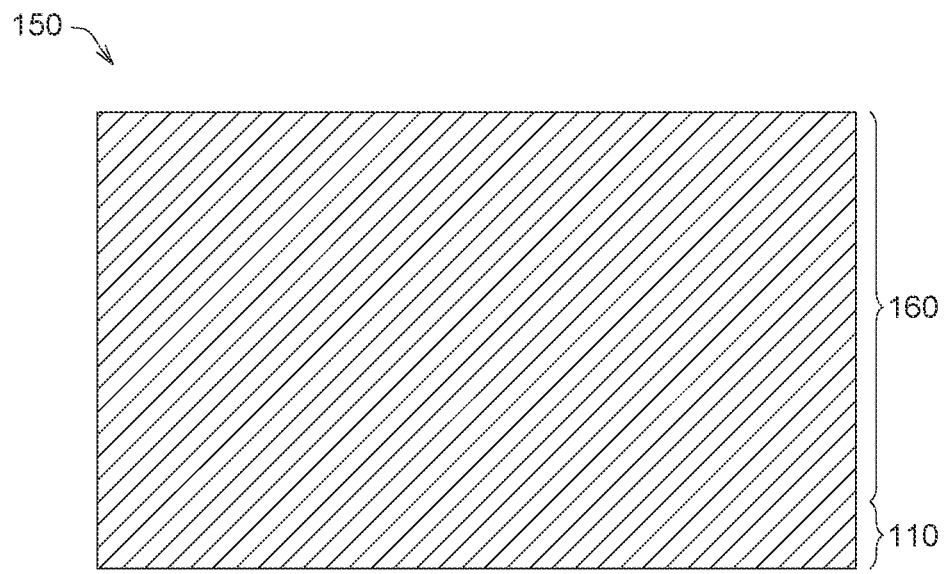
FIG. 3 to FIG. 17 illustrate a manufacturing method for a semiconductor structure in an embodiment.

Referring to FIG. 3, a channel material base 150 is provided. The channel material base 150 comprises the substrate portion 110 (or lower channel material portion) and an upper channel material portion 160 adjoined (or continuously connected) on the substrate portion 110. In an embodiment, the substrate portion 110 and the upper channel material portion 160 may both comprise a single crystal silicon material. In embodiments, the whole of the channel material base 150 (or the substrate portion 110 and the upper channel material portion 160 as a whole) is a semiconductor material formed by a single continuous process (or a common or shared process). In an embodiment, the channel material base 150 may be a silicon wafer cut from a silicon ingot. In an embodiment, the channel material base 150 may be a semiconductor material film formed by a single epitaxial process or a single deposition process performed on a surface of a wafer. The silicon wafer or the semiconductor material film may have a uniform and/or continuous crystal structure. In an embodiment, the channel material base 150 consists of single crystal silicon, such as P-type single crystal silicon.

Figure 4:
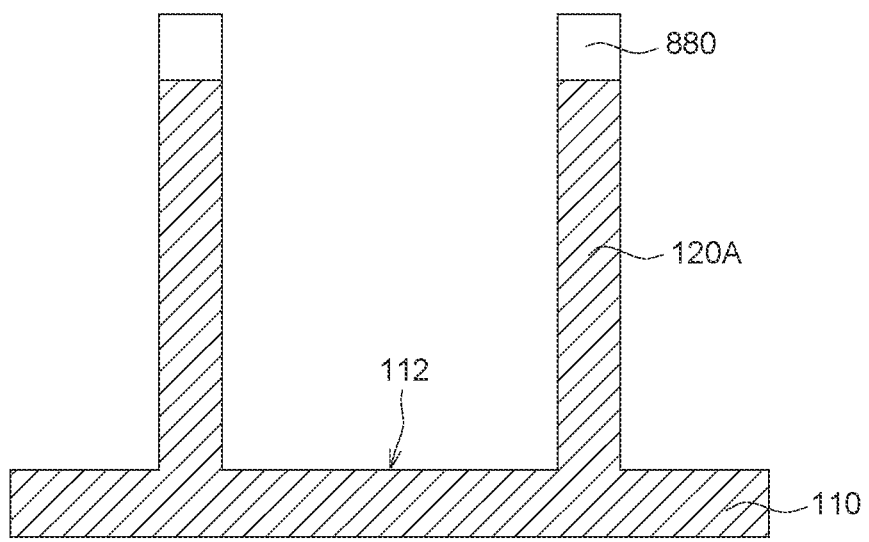

Referring to FIG. 4, a hard mask 880 is formed on the channel material base 150. In an embodiment, the hard mask 880 may comprise an oxide such as silicon oxide. The present disclosure is not limited thereto. The hard mask 880 may use other suitable materials. An etching step is performed with using the hard mask 880 as an etching mask to pattern the upper channel material portion 160 so as to form the vertical channel portion 120A, and define the upper substrate surface 112 of the substrate portion 110. The vertical channel portion 120A may have a pillar shape.

Figure 5:
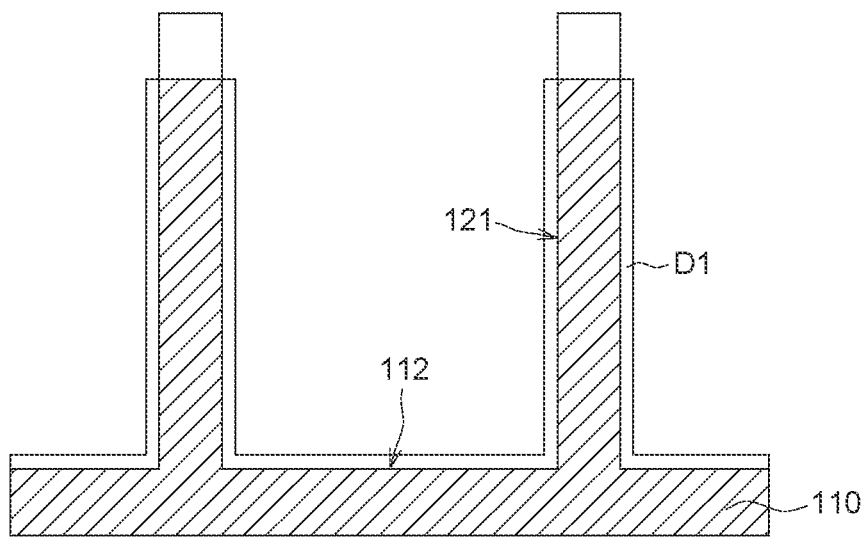

Referring to FIG. 5, the first dielectric layer D1 is formed on the upper substrate surface 112 of the substrate portion 110 and the channel sidewall surface 121 of the vertical channel portion 120A. In an embodiment, the first dielectric layer D1 may comprise an oxide such as silicon oxide formed by an oxidation process. The present disclosure is not limited thereto. The first dielectric layer D1 may use other proper dielectric materials formed by suitable deposition processes.

Figure 6:
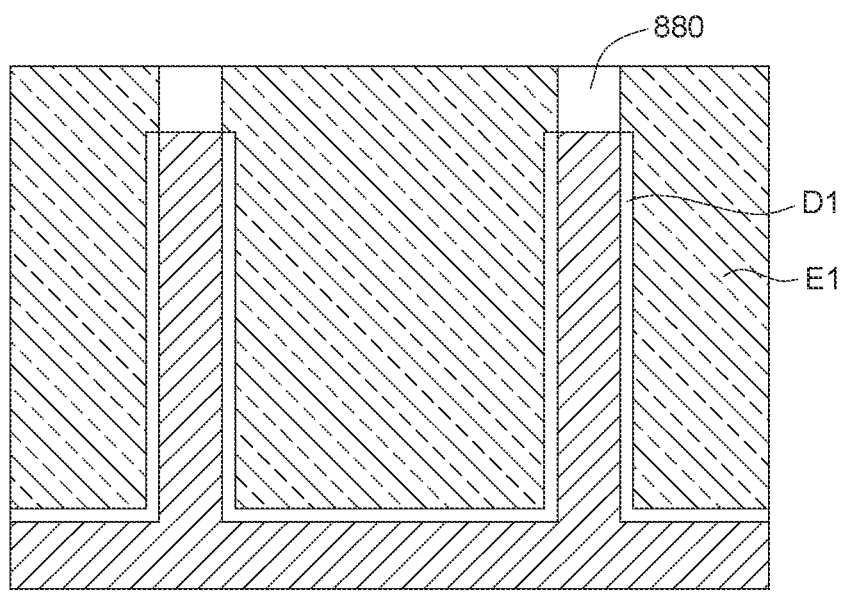

Referring to FIG. 6, the first gate electrode layer E1 may be formed the first dielectric layer D1 and the hard mask 880. The first gate electrode layer E1 may comprise a poly crystal silicon material or other suitable semiconductor materials, formed by a deposition process. In an embodiment, the first gate electrode layer E1 comprises an N-type heavily doped poly crystal silicon material. The present disclosure is not limited thereto. The first gate electrode layer E1 may use a conductive material. A chemical mechanical polishing process may be performed to flatten the semiconductor structure.

Figure 7:
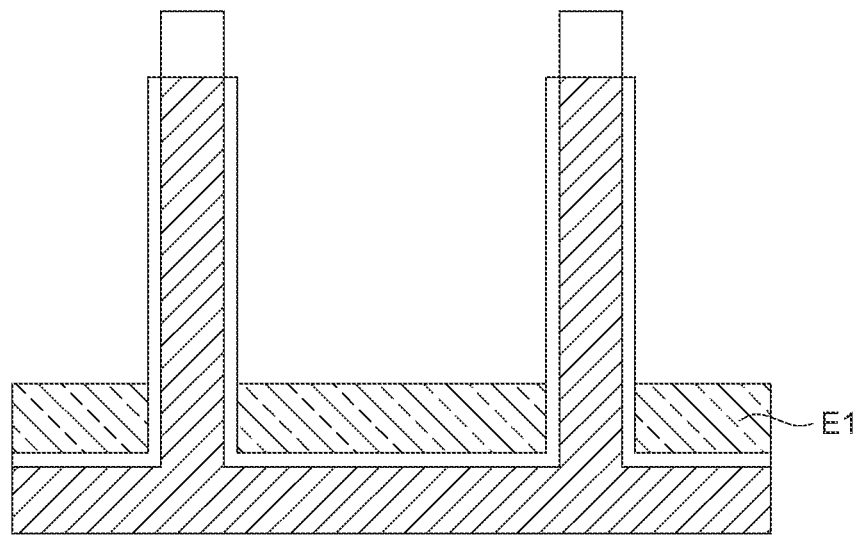

Referring to FIG. 7, the first gate electrode layer E1 may be etched back by a selective etching process.

Figure 8:
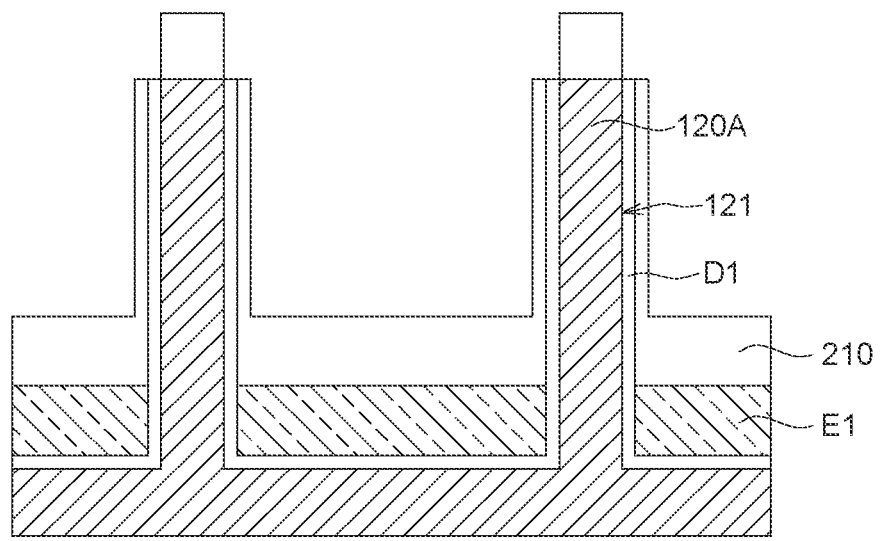

Referring to FIG. 8, the first insulating layer 210 is formed on the upper surface of the first gate electrode layer E1, and on the channel sidewall surface 121 of the vertical channel portion 120A. In an embodiment, the first insulating layer 210 may comprise an oxide such as silicon oxide formed by an oxidation process. A portion of the first insulating layer 210 on the upper surface of the first gate electrode layer E1 may be thicker than another portion of the first insulating layer 210 on the channel sidewall surface 121 of the vertical channel portion 120A. The present disclosure is not limited thereto. The first insulating layer 210 may use other dielectric materials formed by a deposition process properly.

Figure 9:
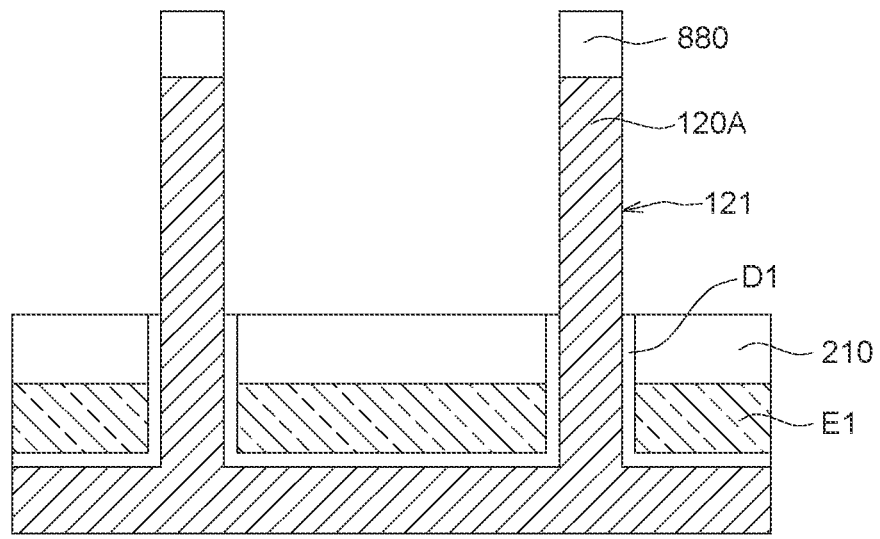

Referring to FIG. 9, portions of the first insulating layer 210 and the first dielectric layer D1 on the channel sidewall surface 121 of the vertical channel portion 120A may be removed by a selective etching process. In embodiments, the hard mask 880 and a portion of the first insulating layer 210 on the upper surface of the first gate electrode layer E1 may be shrank through this selective etching process.

In another embodiment, the first insulating layer 210 is deposited on the semiconductor structure of FIG. 7, and then is flattened by a chemical mechanical planarization process. Next, the first insulating layer 210 and the first dielectric layer D1 are etched by a reactive-ion etching (RIE) method so as to obtain the semiconductor structure as shown in FIG. 9.

Figure 10:
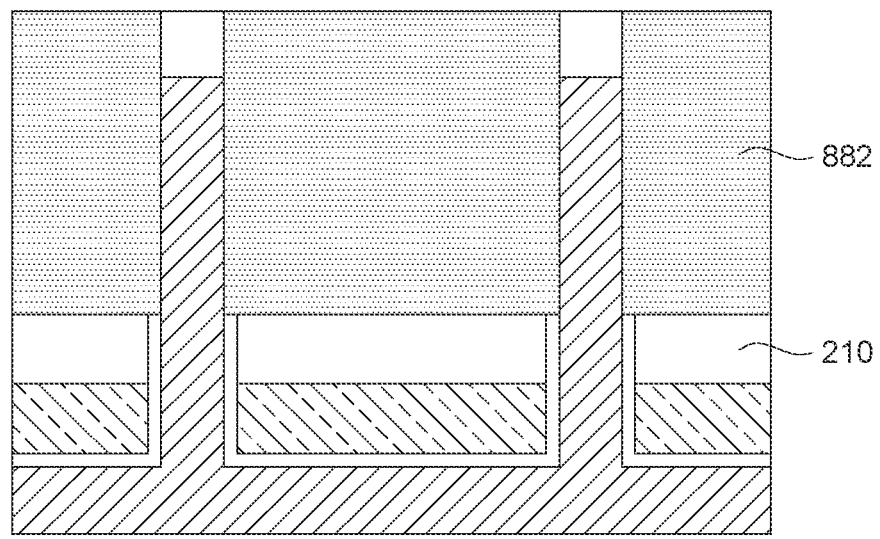

Referring to FIG. 10, a material layer 882 is formed on the first insulating layer 210. In an embodiment, the material layer 882 may comprise a nitride such as silicon nitride formed by a deposition process. The present disclosure is not limited thereto. The material layer 882 may use other suitable materials. A chemical mechanical polishing process may be performed to flatten the semiconductor structure.

Figure 11:
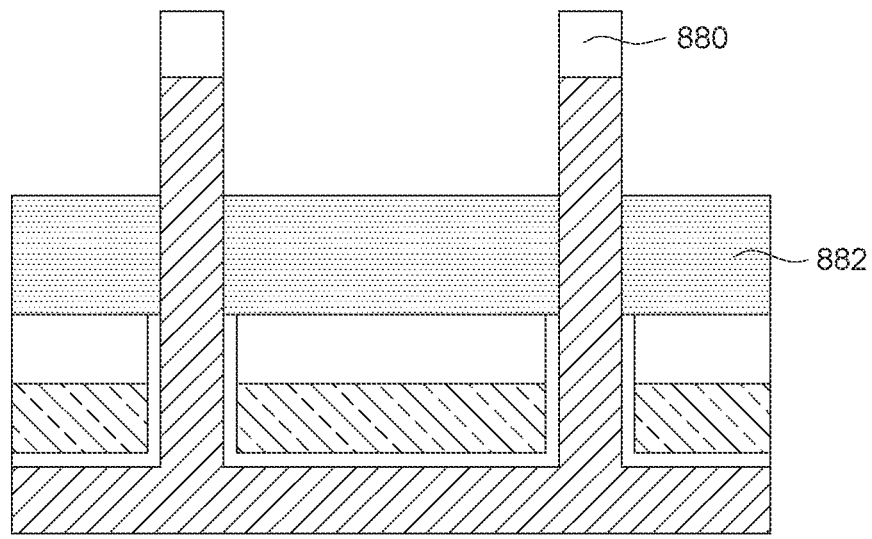

Referring to FIG. 11, the material layer 882 may be etched back by a selective etching process.

Figure 12:
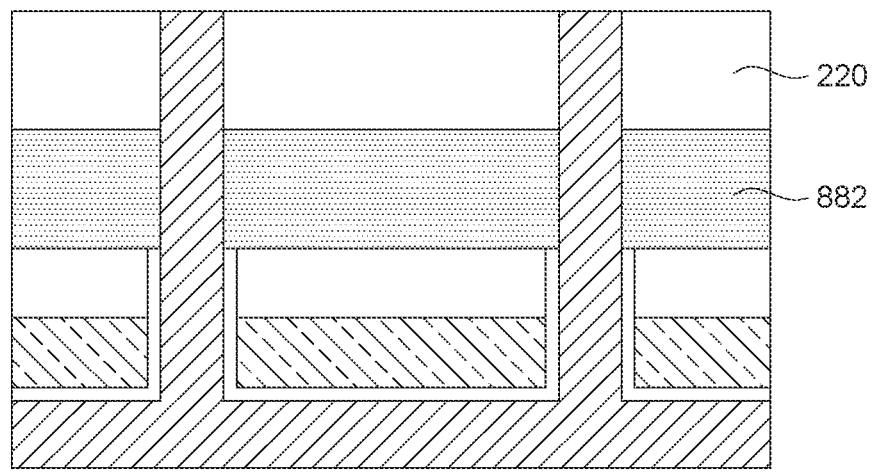

Referring to FIG. 12, the second insulating layer 220 is formed on the material layer 882. In an embodiment, the second insulating layer 220 may comprise an oxide such as silicon oxide formed by a deposition process. The present disclosure is not limited thereto. The second insulating layer 220 may use other suitable dielectric materials. A chemical mechanical polishing process may be performed to remove the hard mask 880 and flatten the semiconductor structure.

Figure 13:
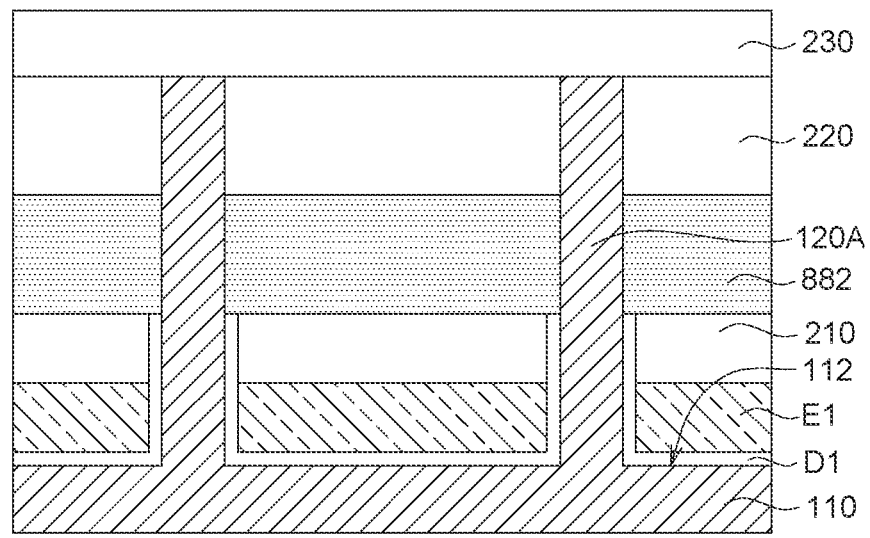

Referring to FIG. 13, the third insulating layer 230 is formed on the second insulating layer 220 and the vertical channel portion 120A. In an embodiment, the third insulating layer 230 may comprise an oxide such as silicon oxide formed by a deposition process. The present disclosure is not limited thereto. The third insulating layer 230 may use other suitable dielectric materials. A stacked structure 884 may comprise the first dielectric layer D1, the first gate electrode layer E1, the first insulating layer 210, the material layer 882, the second insulating layer 220 and the third insulating layer 230. The stacked structure 884 is on the upper substrate surface 112 of the substrate portion 110.

Figure 14:
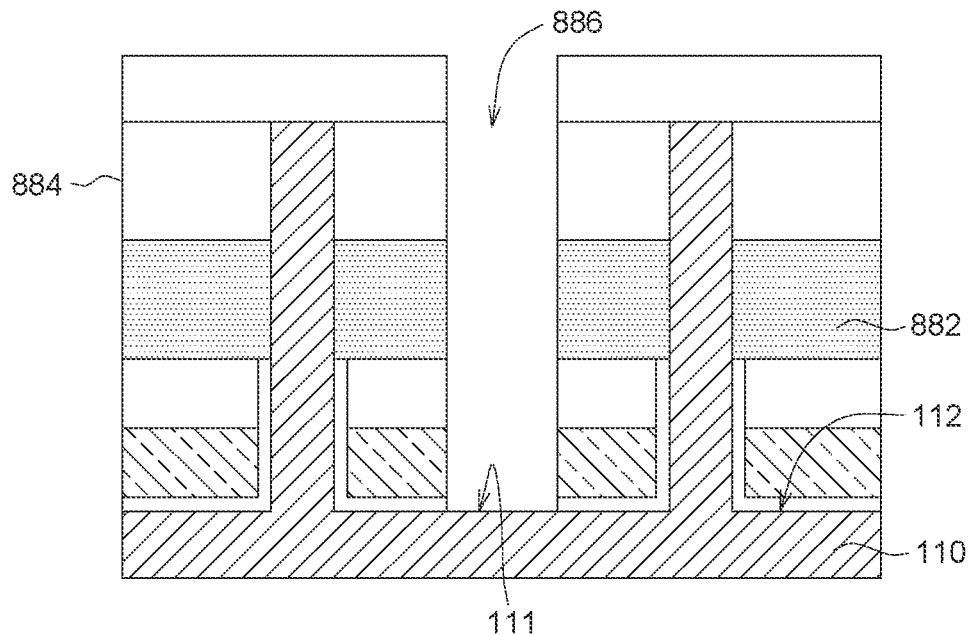

Referring to FIG. 14, an etching step is performed to pattern the stacked structure 884 to form an opening 886 passing through the stacked structure 884, and exposing the first upper channel end surface 111 of the substrate portion 110. The first upper channel end surface 111 may be aligned with the upper substrate surface 112 not exposed by the opening 886, or may be below the upper substrate surface 112.

Figure 15:
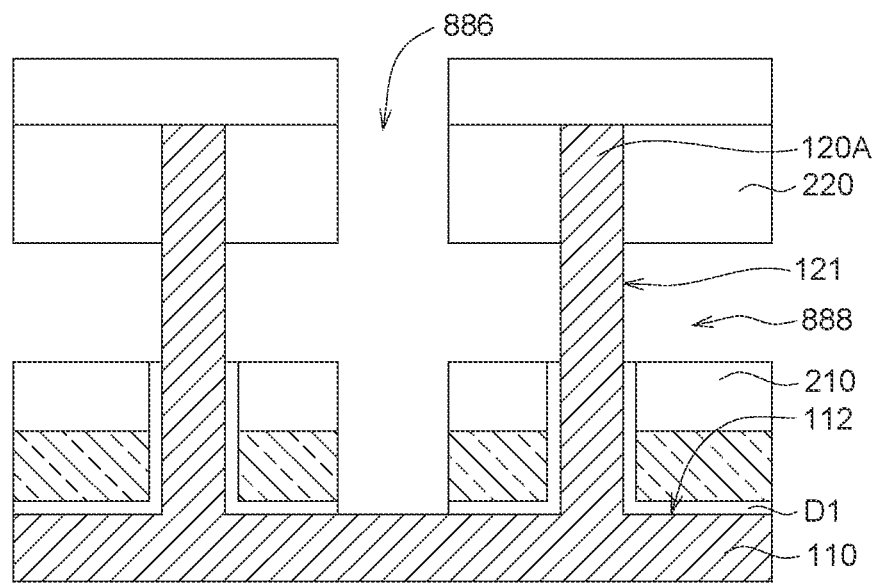

Referring to FIG. 15, the material layer 882 exposed by the opening 886 may be removed by a selective etching process to form a slit 888. The slit 888 may expose the channel sidewall surface 121 of the vertical channel 120A, the upper surfaces of the first insulating layer 210 and the first dielectric layer D1, and a lower surface of the second insulating layer 220.

Figure 16:
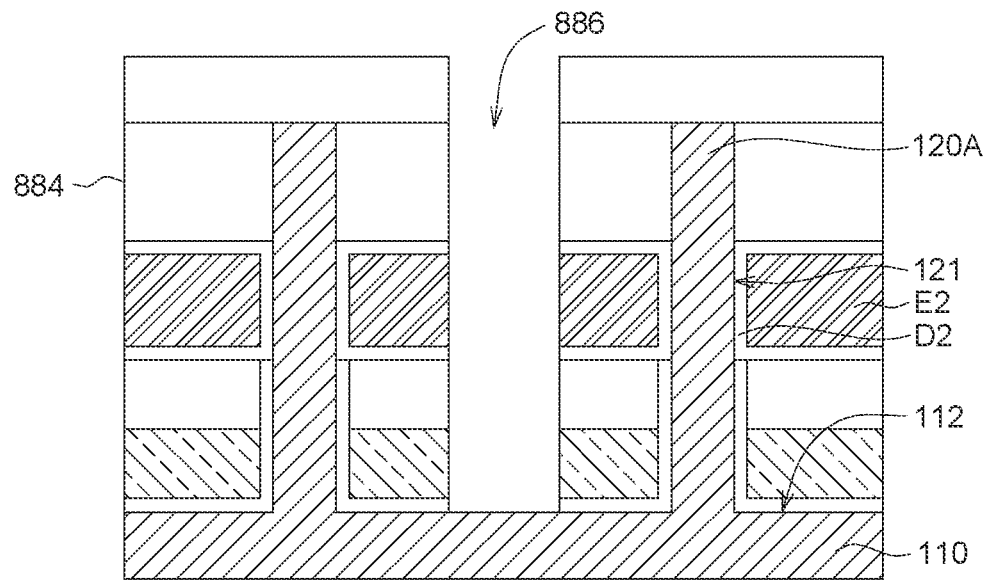

Referring to FIG. 16, the second dielectric layer D2 is formed in the slit 888. The second dielectric layer D2 may be formed by a deposition process. The second dielectric layer D2 is on the upper substrate surface 112 of the substrate portion 110 and the channel sidewall surface 121 of the vertical channel portion 120A. The second gate electrode layer E2 is formed on the second dielectric layer D2 in the slit 888. The second gate electrode layer E2 may comprise a metal formed by a deposition process. The present disclosure is not limited thereto. The second gate electrode layer E2 may use other suitable conductive materials. In an embodiment, a portion of the second dielectric layer D2 and the second gate electrode layer E2 formed on the sidewall surface of the stacked structure 884 exposed by the opening 886 may be removed by an etching back process.

Figure 17:
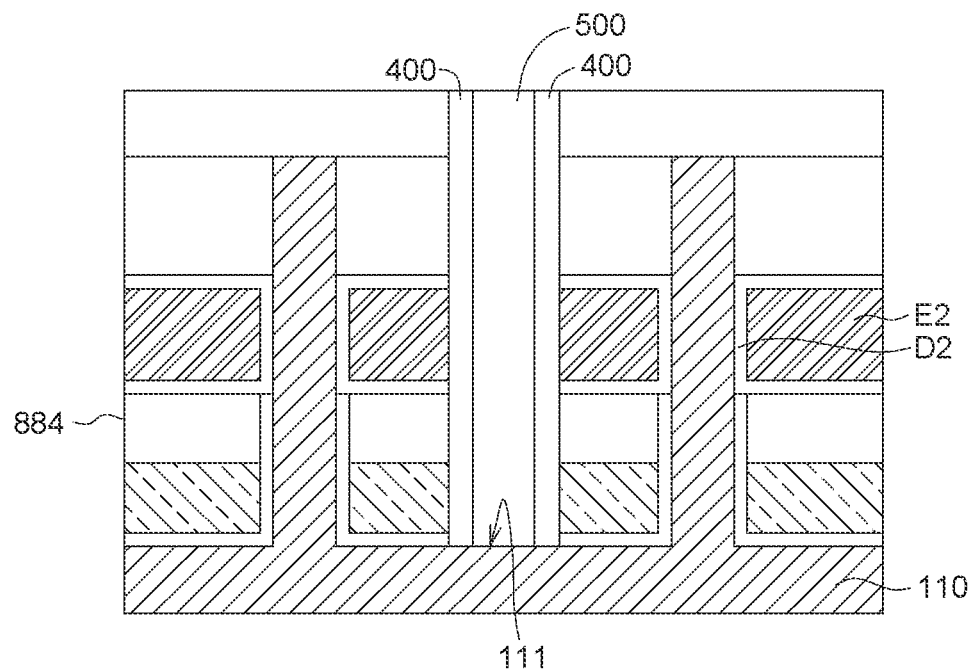

Referring to FIG. 17, the insulating element 400 is formed on the sidewall surface of the stacked structure 884, the sidewall surface of the second dielectric layer D2, and the sidewall surface of the second gate electrode layer E2 exposed by the opening 886. The insulating element 400 may have a line shape. In an embodiment, the insulating element 400 may comprise an oxide such as silicon oxide formed by a deposition process. The present disclosure is not limited thereto. The insulating element 400 may use other suitable dielectric materials. The conductive layer 500 is formed on the first upper channel end surface 111 of the substrate portion 110 and the sidewall surface of the insulating element 400. The conductive layer 500 may comprise a TiN film used as a barrier layer and a W film formed on the TiN film. The present disclosure is not limited thereto. The conductive layer 500 may comprise other metal or conductive materials formed by a deposition process. In an embodiment, the processes described above may be used to form the semiconductor structure as shown in FIG. 1.

Figure 18:
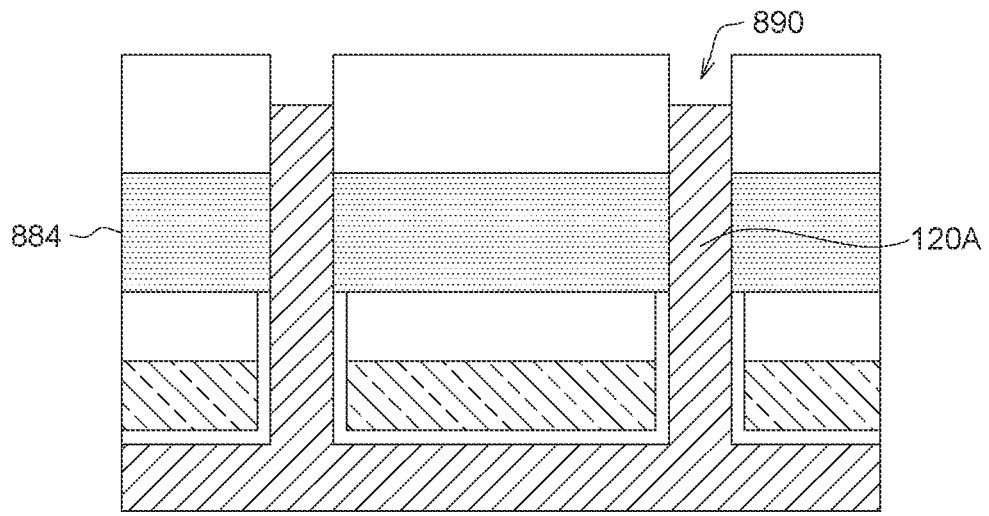
FIG. 18 to FIG. 22 illustrate a manufacturing method for semiconductor structure in another embodiment.

FIG. 18 to FIG. 22 illustrate a manufacturing method for semiconductor structure in another embodiment. In an embodiment, a manufacturing step as shown in FIG. 18 may be performed after the manufacturing step illustrated with referring to FIG. 12.

Referring to FIG. 18, the vertical channel portion 120A may be etched back to form a recess 890 exposing the sidewall surface of the stacked structure 884. In an embodiment, the etching back may use a reactive-ion etching (RIE) method.

Figure 19:
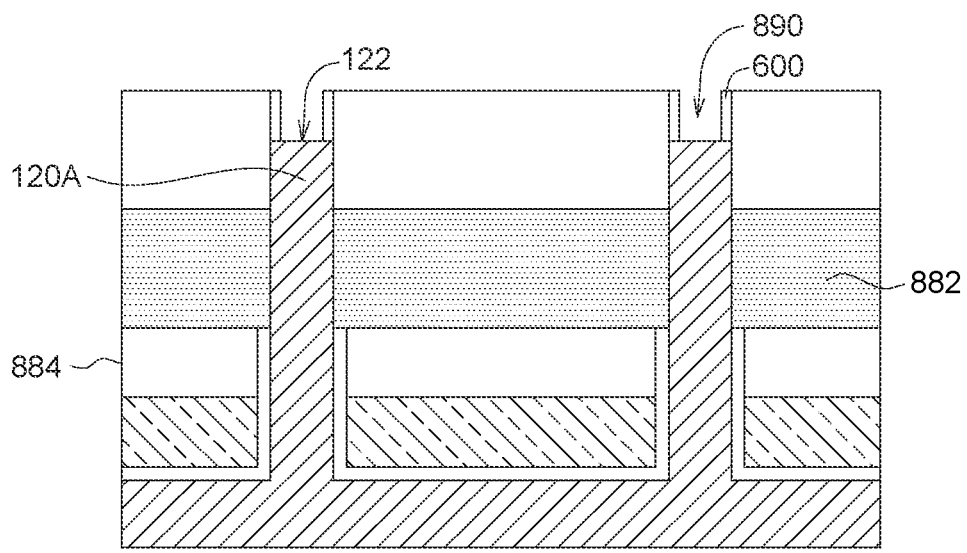

Referring to FIG. 19, the spacer 600 is formed on the second upper channel end surface 122 of the vertical channel portion 120A and the sidewall surface of the stacked structure 884 exposed by the recess 890. The spacer 600 may have a tubular shape. In an embodiment, the spacer 600 may comprise an oxide such as silicon oxide formed by a deposition process. The present disclosure is not limited thereto. The spacer 600 may use other suitable dielectric materials. The second upper channel end surface 122 of the vertical channel portion 120A is above a top surface of the material layer 882.

Figure 20:
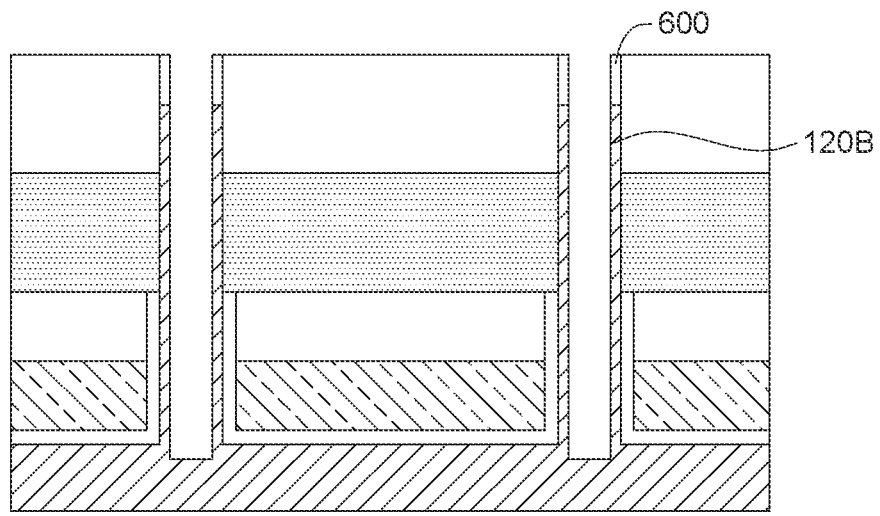

Referring to FIG. 20, an etching step is performed to the vertical channel portion 120A with using the spacer 600 as an etching mask so as to form the vertical channel portion 120B having a tubular shape. In an embodiment, the etching step may use a reactive-ion etching method.

Figure 21:
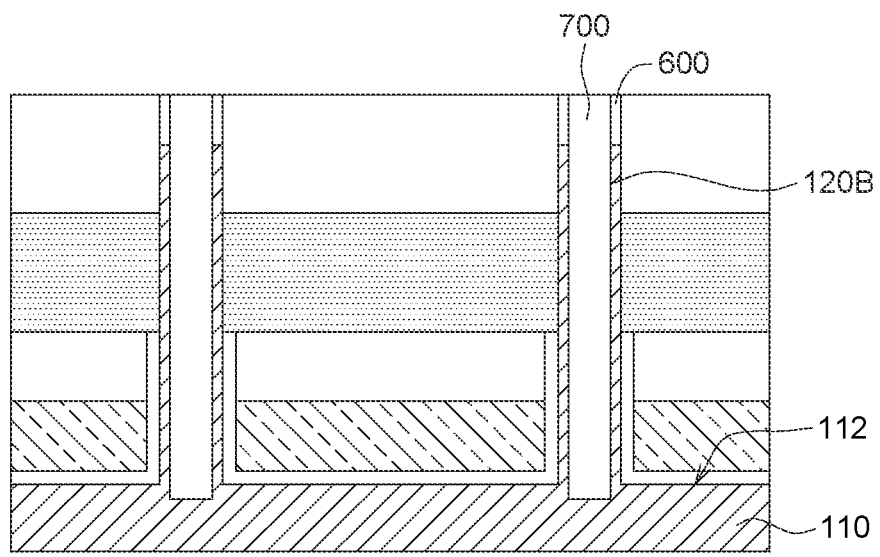

Referring to FIG. 21, the insulating pillar 700 is formed in the spacer 600 and the vertical channel portion 120B. In an embodiment, the insulating pillar 700 may comprise an oxide such as silicon oxide formed by a deposition process. The present disclosure is not limited thereto. The insulating pillar 700 may use other suitable dielectric materials. In one of the embodiments, the bottom surface of the insulating pillar 700 is below the upper substrate surface 112 of the substrate portion 110.

Figure 22:
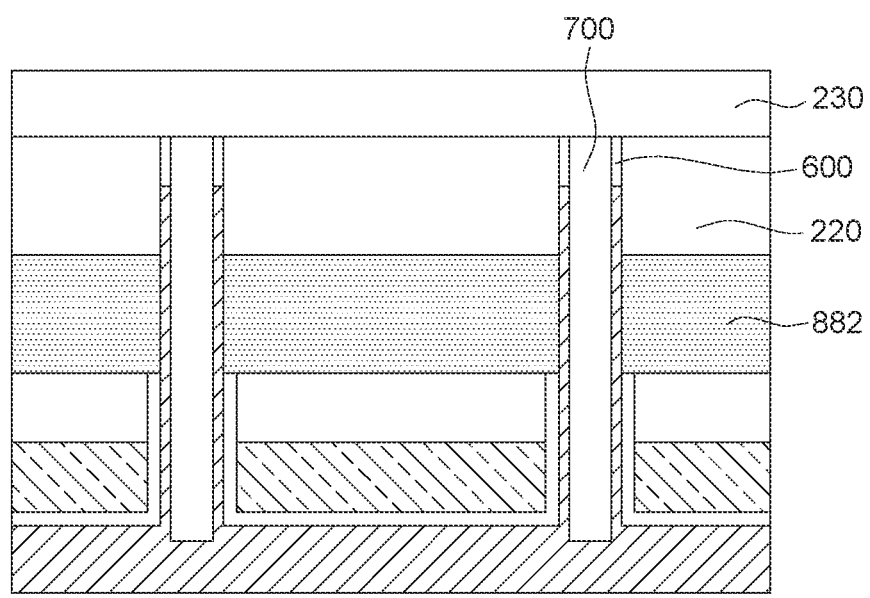

Referring to FIG. 22, the third insulating layer 230 is formed on the second insulating layer 220, the spacer 600 and the insulating pillar 700.

Next, manufacturing steps similar with those described with referring to FIG. 14 to FIG. 17 may be performed so as to remove the material layer 882, and form the second dielectric layer D2, the second gate electrode layer E2, the insulating element 400 and the conductive layer 500. In an embodiment, by the manufacturing steps described above, the semiconductor structure as shown in FIG. 2 may be formed.

In embodiments according to the present disclosure, the channel element (such as the channel element 100A, or the channel element 100B) is formed from the channel material base 150 formed by a single continuous process (or common/shared process). Therefore, the channel element has no crystal interface therein. As such, the channel element in embodiments can have high carrier mobility.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
a channel element comprising a substrate portion and a vertical channel portion, wherein the vertical channel portion is adjoined on the substrate portion, the substrate portion and the vertical channel portion both comprise single crystal silicon, the substrate portion comprises an upper substrate surface, the vertical channel portion comprises a channel sidewall surface;
a first gate electrode layer on the channel sidewall surface of the vertical channel portion;
a first dielectric layer between the first gate electrode layer and the channel element,
a second gate electrode layer on the upper substrate surface of the substrate portion and the channel sidewall surface of the vertical channel portion, wherein the first gate electrode layer is between the second gate electrode layer and the upper substrate surface of the substrate portion; and
a second dielectric layer adjacent to and between a sidewall surface of the second gate electrode layer and the channel sidewall surface of the vertical channel portion,
wherein the first dielectric layer and the second dielectric layer comprise different materials, an upper surface of the first dielectric layer is connected to the second dielectric layer.

2. The semiconductor structure according to claim 1, comprising an access transistor, wherein the access transistor comprises the channel element, the first gate electrode layer and the first dielectric layer.

3. The semiconductor structure according to claim 1, comprising a memory transistor, wherein the memory transistor comprises the channel element, the second gate electrode layer and the second dielectric layer.

4. The semiconductor structure according to claim 3, comprising an access transistor, wherein the access transistor comprises the channel element, the first gate electrode layer and the first dielectric layer.

5. The semiconductor structure according to claim 4, wherein the second dielectric layer of the memory transistor has a material set different from a material set of the first dielectric layer of the access transistor.

6. The semiconductor structure according to claim 1, further comprising an insulating pillar passing through the vertical channel portion.

7. The semiconductor structure according to claim 1, wherein the channel element has opposing end surfaces electrically connected to a source terminal and a drain terminal respectively.

8. A semiconductor structure, comprising:
a channel element comprising a substrate portion and a vertical channel portion, wherein the vertical channel portion is adjoined on the substrate portion, the substrate portion and the vertical channel portion as a whole have a uniform and/or continuous crystal structure, the substrate portion comprises an upper substrate surface, the vertical channel portion comprises a channel sidewall surface;
a first gate electrode layer on the channel sidewall surface of the vertical channel portion;
a first dielectric layer between the first gate electrode layer and the channel element,
a second gate electrode layer on the upper substrate surface of the substrate portion and the channel sidewall surface of the vertical channel portion, wherein the first gate electrode layer is between the second gate electrode layer and the upper substrate surface of the substrate portion; and
a second dielectric layer adjacent to and between a sidewall surface of the second gate electrode layer and the channel sidewall surface of the vertical channel portion,
wherein the first dielectric layer and the second dielectric layer comprise different materials, an upper surface of the first dielectric layer is connected to the second dielectric layer.

9. The semiconductor structure according to claim 8, wherein the substrate portion and the vertical channel portion as a whole have no crystal interface therein.

10. The semiconductor structure according to claim 8, further comprising an insulating pillar passing through the vertical channel portion.

11. The semiconductor structure according to claim 8, further comprising an access transistor, wherein the access transistor comprises the channel element, the first gate electrode layer and the first dielectric layer.

12. The semiconductor structure according to claim 8, further comprising a conductive layer on a first upper channel end surface of the substrate portion, the substrate portion is electrically connected between the conductive layer and the vertical channel portion.

* * * * *